United States Patent [19]

Margosian et al.

[11] Patent Number: 5,297,551
[45] Date of Patent: Mar. 29, 1994

[54] WEIGHTED RAY PROJECTION IMAGING FOR MR ANGIOGRAPHY

[75] Inventors: Paul M. Margosian, Lakewood; Haiying Liu, Euclid, both of Ohio

[73] Assignee: Picker International, Inc., Highland Hts., Ohio

[21] Appl. No.: 925,999

[22] Filed: Aug. 6, 1992

[51] Int. Cl.$^5$ .............................. A61B 5/055
[52] U.S. Cl. .................. 128/653.2; 382/6; 382/54; 364/413.13
[58] Field of Search .......... 128/653.2, 653.3; 382/6, 54; 364/413.13, 413.17, 413.19; 324/306, 309

[56] References Cited

U.S. PATENT DOCUMENTS

| | | | |
|---|---|---|---|
| 4,761,819 | 8/1988 | Denison et al. | 382/6 |
| 4,907,288 | 3/1990 | Shimoni | 382/54 |
| 4,991,092 | 2/1991 | Greensite | 364/413.13 |
| 5,067,163 | 11/1991 | Adachi | 382/6 |
| 5,113,865 | 5/1992 | Maeda et al. | 128/653.2 |
| 5,150,421 | 9/1992 | Morishita et al. | 382/6 |
| 5,166,876 | 11/1992 | Cline et al. | 364/413.13 |
| 5,170,443 | 12/1992 | Todd | 382/6 |
| 5,244,177 | 6/1993 | Doi et al. | 382/54 |

FOREIGN PATENT DOCUMENTS

9117517 11/1991 PCT Int'l Appl. ............ 364/413.13

OTHER PUBLICATIONS

"Volume Neighborhood Criteria and Continuity Conditions for Improved Blood Vessel Conspicuity in MR Angiograms", Margosian, et al., SMRM Book of Abstracts, 1991, p. 200.
"Algorithms to Improve Conspicuity of Blood Vessels in MR Angiograms", Lakshminarayanan, et al., SMRM Book of Abstracts, 1991, p. 759.
"Application of a Connected-Voxel Algorithm to MR Angiographic Data", Saloner, et al., JMRI 1991; 1:423-430.
"Minimum Basis Set MR Subtraction Angiology (MBS-MRA)", Sattin, et al. SMRI '90 Eighth Annual Meeting Program and Abstracts, 446, p. 28.
"Statistical Segmentation and Region Growing Methods for Improving MR Angiograms", Margosian, SMRI '90 Eighth Annual Meeting Program and Abstracts, 249, p. 73.
"The Maximum Intensity Projection As a Segmentation Tool", Denison, et al., SMRI '90 Eighth Annual Meeting Program and Abstracts, 250, p. 73.
"The Hough Transform Applied to 3D MRA Data Sets", Wood, et al., SMRI '90 Eighth Annual Meeting Program and Abstracts, PO84, p. 158.
"Three Dimensional Phase Contrast Angiography", Dumoulin, et al. SMRM Book of Abstracts, 1988, p. 725.
"3D MR Angiography Using Bipolar Gradient Echoes", Laub, et al. SMRM Book of Abstracts, 1987, p. 52.
"3-D Representation of Vessels By Pixel Classification", Laub, et al. SMRM Book of Abstracts, 1986, p. 508.
"SIMP: An Integrative Combination with MIP", Keller, et al. SMRM Book of Abstracts, 1986, p. 201.

Primary Examiner—Lee S. Cohen
Assistant Examiner—Krista M. Pfaffle
Attorney, Agent, or Firm—Fay, Sharpe, Beall, Fagan, Minnich & McKee

[57] ABSTRACT

A magnetic resonance imaging apparatus (A) applies appropriate magnetic fields, magnetic field gradients, and radio frequency pulses across an examination region to generate magnetic resonance signals or views indicative of the properties of a volume of a subject examined in the examination region. The views are reconstructed (B) into voxel values V(x,y,z) and stored in a volumetric image memory (C). A relative angle and position of a viewing plane (10) relative to the image volume are selected. A plurality of rays (14), each corresponding to a pixel P(i,j) of a resultant projection image, are projected from the viewing plane into the volumetric image data. Each ray retrieves a corresponding vector of voxel values $V_1$, $V_2$, $V_3$, ... $V_n$. Bright voxel values indicate blood. Dark pixel values indicate non-blood tissue. Intermediate voxel values have a greater uncertainty whether the pixel value represents blood or non-blood tissue. Probability ranges are determined (30) and used to select powers or exponents N which are used to expand the dynamic range of the voxel values non-linearly. The normalized partial sums of each ray are weightedly averaged (56) to produce the corresponding angiographic projection pixel value for storage in an image memory (F).

20 Claims, 2 Drawing Sheets

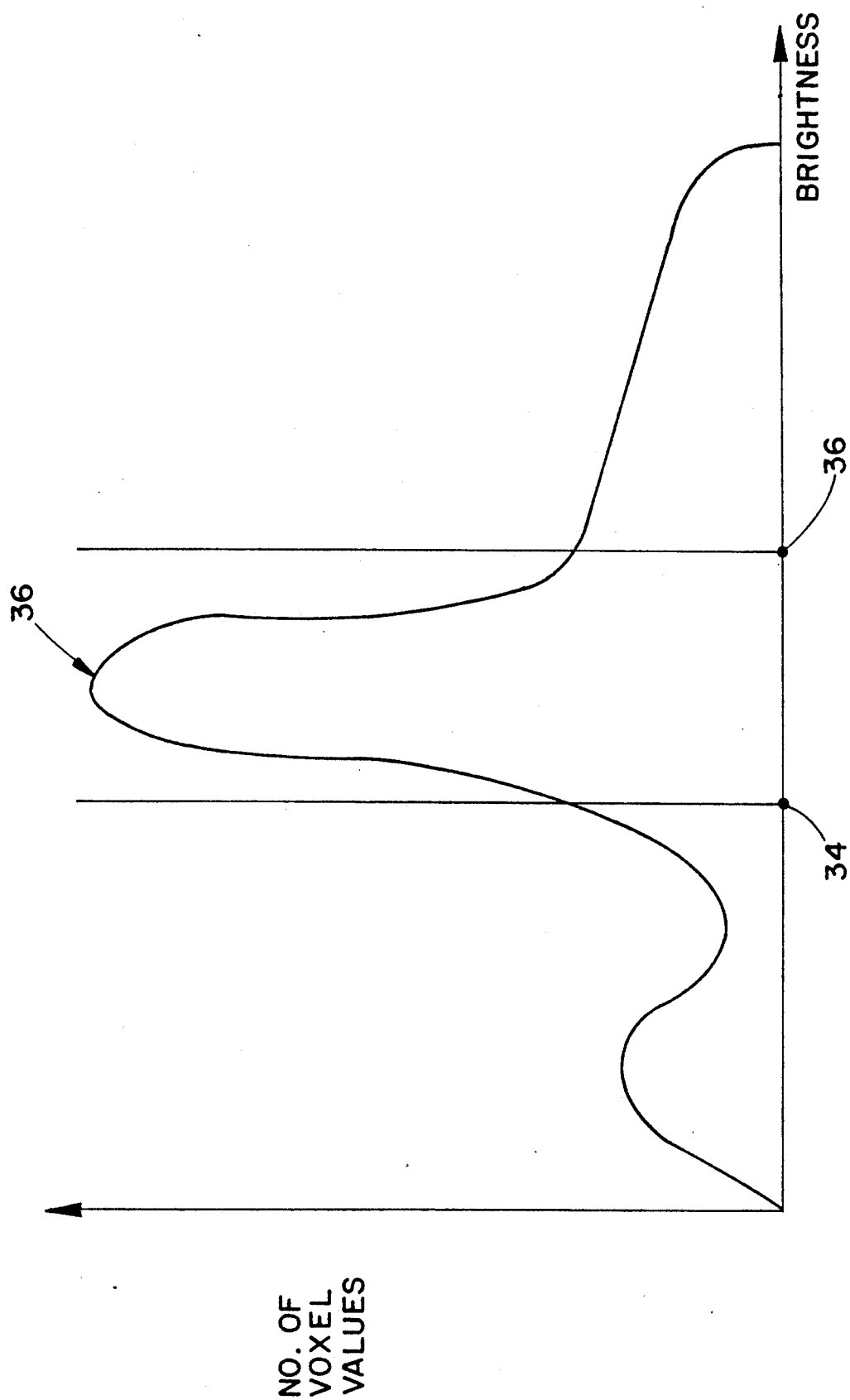

WEIGHTED RAY PROJECTION IMAGING FOR MR ANGIOGRAPHY

BACKGROUND OF THE INVENTION

The present invention relates to the diagnostic imaging arts. It finds particular application in conjunction with magnetic resonance angiography and will be described with particular reference thereto. However, the invention may find application in other imaging areas in which image values have a wide dynamic range and varying degrees of uncertainty associated with different pixel brightness levels.

In x-ray angiography, x-rays which pass through the patient are used to expose photographic film. One or more shadowgraphic or projection x-ray image is taken through a region of interest of the patient. In order to improve contrast between the patient's blood vessels and surrounding tissue, the patient is commonly injected with a contrast agent. The x-ray contrast agents commonly cause the patient's blood to attenuate the x-ray beam 200-300 times as much as comparable volumes of surrounding tissue. The resultant angiographic film image has a dark background where there are no blood vessels, and the blood vessels clearly delineated in white. There is a characteristic translucent appearance where blood vessels cross.

Analogous projection or shadowgraphic angiographic images can be created from magnetic resonance imaging. Most commonly, pixel values are determined for each pixel in a volumetric region defined by a plurality of parallel, planar magnetic resonance images. A viewing plane is defined outside of the volume orthogonal to a direction from which the radiologist wishes to view the material in the volume. The viewing direction is generally parallel to the direction that the x-ray beam would have been directed in x-ray angiography. The viewing plane is divided into pixels corresponding to pixels of a resultant video angiographic image and a ray is projected from each pixel orthogonal to the viewing plane (parallel to the viewing direction) into the volume. A value for each pixel of the image is derived from the brightness or voxel values of each voxel that the corresponding ray intersects as it passes through the volume region.

One difficulty with the magnetic resonance data is that the blood vessels are only 2 to 3 times as bright as the surrounding tissue. This small differentiation between the blood vessels and surrounding tissue causes the MR angiographic images to lack the definition and contrast characteristic of the x-ray angiographic images.

In one technique for imparting the visual image characteristics of an x-ray angiography image into a magnetic resonance angiography image, the pixel values along each projected ray are examined to find the pixel with the maximum intensity. This technique is often called the "Maximum Intensity Projection" or MIP technique. This causes the brightest object along each ray to be displayed on the resultant projection image at full intensity. This improved the brightness of the blood vessels. See Laub, et al., "3D MR Angiography Using Bipolar Gradient Echoes" SMRM Book of Abstracts, p. 52, 1987. The surrounding tissue also tends to become bright or more gray, reducing the blackness of the background. Another difficulty with the resultant images resides in the visual representation of blood vessels which cross over or pass by each other. Both crossing blood vessels are displayed with a continuum of substantially the same intensity. This makes the cross over region look like an intersection or interconnection between the blood vessels. The characteristic translucent appearance of conventional x-ray angiograms along the cross over is missing.

In one technique for attempting to achieve the translucence where vessels cross each other, the pixel values of each ray are examined to determine whether the ray passes through a significant blood vessel, i.e., is in a brighter region of the image. If the ray passes through at least two pixels above a preselected threshold, then the pixel values along the ray are integrated. For rays without two pixels above the threshold, the maximum intensity or brightness pixel is selected as described by Laub. For a more pleasing result, the integrated pixel values are scaled between the threshold and an arbitrary maximum intensity. See Keller, et al. "SIMP: An Integrative Combination With MIP", SMRM Book of Abstracts, 1986. Although this improved the appearance of MR angiographic images, the images were still significantly lacking in the appearance characteristics of x-ray angiographic images.

The present invention contemplates a new and improved technique for producing magnetic resonance angiographic images with the visual characteristics of x-ray angiographic images.

SUMMARY OF THE INVENTION

In accordance with one aspect of the present invention, the pixel values along each ray of a ray projection image are raised to a power, which power varies in accordance with the relative uncertainty of the nature of the tissue corresponding to each pixel value.

In accordance with a more limited aspect of the present invention, bright pixel values which have a relatively high certainty of being blood and low pixel values which have a relatively high certainty of being non-blood tissue are raised to a relatively low power. Intermediate pixel values which have a relatively high uncertainty as to whether they represent other tissue types, a combination of blood and non-blood tissue, or the like are raised to a relatively high power.

In accordance with a more limited aspect of the present invention, the sum of the pixel values raised to the low and high power are normalized by dividing by the sum of pixel values raised to a lower power.

In accordance with a very limited, specific implementation of the present invention, the pixel values in the brightest and darkest regions are squared and summed. The sum of the squared pixel values is divided by the sum of the pixel values for normalization purposes. The pixel values in the intermediate range are raised to the eleventh power and summed. The sum is divided by the sum of the pixel values raised to the tenth power for normalization purposes.

In accordance with another aspect of the present invention, the values along each projection ray are combined with a self-normalizing intensity weighting. More specifically to the preferred embodiment, each pixel value along which the projection ray passes is raised to a power or exponent and the pixel values raised to the exponent along the ray or ray portions are summed to produce a pixel value for the projection image. The projection image value is normalized by dividing the sum by a sum of the same pixels with each raised to a lower power.

One advantage of the present invention is that it achieves a clearer depiction of the crossing of blood vessels.

Another advantage of the present invention resides in its large dynamic range, without saturating at the bright end.

Another advantage of the present invention is the lower background noise.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
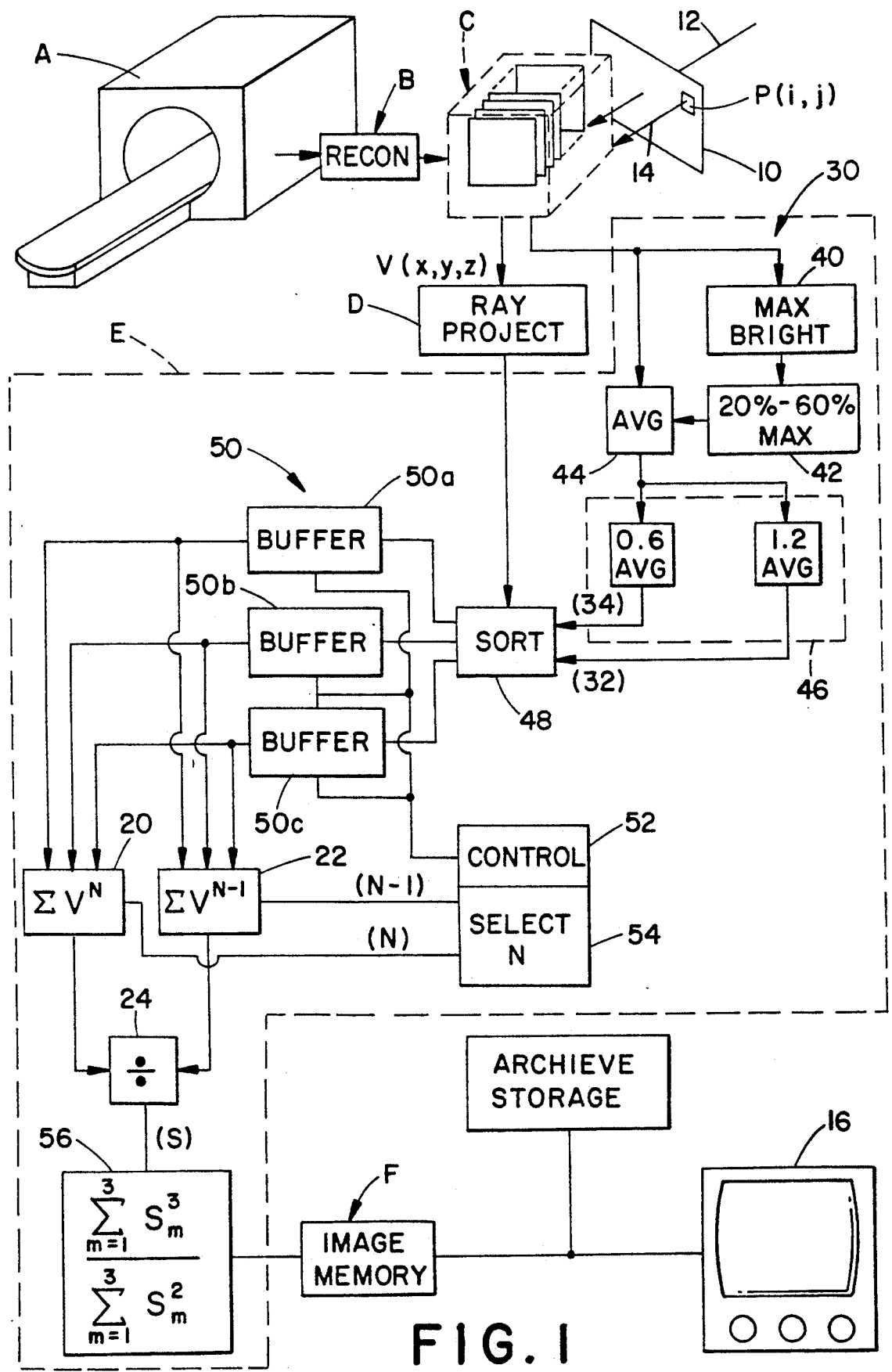
FIG. 1 is a diagrammatic illustration of a magnetic resonance apparatus for generating angiographic images in accordance with the present invention; and, FIG. 2 is an exemplary histogram illustrating a distribution of pixel values versus frequency of occurrence in a typical volumetric region taken for angiography purposes.

A magnetic resonance medical diagnostic scanner or other source of image data A generates raw data sets or views. More specifically to the preferred embodiment, the magnetic resonance scanner subjects a portion of the subject in an examination region to a strong uniform magnetic field. Magnetic field gradient pulses and RF pulses are applied to excite dipoles in the examination region to resonance and to encode such resonance spatially. The resultant resonance signals are received and digitized to form the views. An image reconstruction means B reconstructs the views into a multi-dimensional image representation. In the preferred, magnetic resonance embodiment, the reconstruction means uses an inverse Fourier transform algorithm. The image representation includes a multiplicity of voxel gray scale or brightness values, each of which corresponds to one of a multiplicity of voxels arranged in a three-dimensional rectangular array. The voxels, each of which are the same size, each have a corresponding voxel value $V(x,y,z)$ indicative of a magnetic resonance property of a corresponding volumetric region of the subject. The voxel values corresponding to each voxel are stored in a volume memory means C.

Each voxel brightness value $V(x,y,z)$ is retrievable by addressing the volume memory means C with corresponding orthogonal addresses $(x,y,z)$. A ray projection or shadowgraphic image generating means D generates a two-dimensional projection image representation from all or a portion of the volumetric data in the memory means C. The projection image represents a projection of the volume data onto a two-dimensional viewing plane 10 which is transverse to a selectable viewing direction 12. In the preferred embodiment, the viewing plane 10 is divided into the pixels $P(i,j)$ of the projection image representation. A ray 14 is projected from each pixel $P(i,j)$ of the viewing plane parallel to the viewing direction 12, i.e. transverse to the viewing plane. The ray projection means D projects the ray 14 through the voxels and identifies which voxels $V(x,y,z)$ the ray intersects. The voxel values $V(x,y,z)$ corresponding to each intersected voxel are read to produce a series or vector of voxel values $V_1, V_2, V_3, \ldots V_n$ corresponding to each ray. Various averaging or weighting of voxel values may be used, as is known in the art, to compensate for whether the ray passes directly through a voxel, between two voxels, and the like.

Each ray or vector of voxel values is passed to a ray processing and image enhancement means E. The image enhancement means E performs a non-linear expansion of the voxel values and combines them into a weighted average pixel value $P(i,j)$ which is supplied to an image memory F for storage in the corresponding memory cell $(i,j)$. In this manner, when the data in the image memory F is displayed on a video monitor 16, a human-readable brightness or gray scale is displayed on the screen which corresponds to the brightness or pixel value stored in the corresponding cell of the image memory F.

The image enhancement means E includes a non-linear voxel value expansion means 20 for creating a non-linear increase in the separation between voxel values of similar brightness. More specifically, the non-linear expansion means 20 raises each voxel value to a selectable power or exponent N and sums them. Raising to a higher power or exponent separates seemingly similar brightness values, providing greater differentiation between blood and non-blood tissues. However, this expansion to differentiate between similar voxel values also extends the dynamic range of the data. A self-normalizing means 22 normalizes the expanded data to bring it back into an acceptable dynamic range for display on the video monitor 16. In the preferred embodiment, the normalizing means sums the pixel values raised to a power or exponent of $N-1$. Of course, other exponents which are on average lower than those in the expanding means may also be used. A dividing means 24 divides the expanded sum by the self-normalizing sum to create an appropriately normalized pixel value $P(i,j)$ for storage in the appropriate memory cell of the image memory means F.

$$P(i,j) = \frac{\sum_n V_n^N}{\sum_n V_n^{N-1}} . \tag{1}$$

In accordance with a more refined version of the present invention, the degree of extension of the dynamic range, particularly the magnitude of the exponent N is adjusted in accordance with a probability that a particular pixel or brightness value is indicative of blood or non-blood tissue. More specifically, a probability means 30 determines probability curve characteristics indicative of the probability that each voxel value represents blood or non-blood tissue. With reference to FIG. 2, a plot of intensity or brightness versus the number of voxel values in volume memory C with each brightness typically produces a histogram analogous to FIG. 2. Voxel values in a brightest most range, above brightness 32, almost certainly correspond to blood. Similarly, voxel values below brightness 34 are almost certain to indicate non-blood tissue. However, brightness values between 32 and 34 could be various types of non-blood tissue, a combination of blood and non-blood tissue, or the like.

The probability function means 30 looks to expand the pixel values in the uncertain region between brightness values 32 and 34 to the largest degree. To this end, the probability means 30 provides an indication of the probability curve indicating the probability that each pixel or brightness value represents blood, non-blood tissue, or is uncertain. In the illustrated embodiment, the probability curve means provides an indication of the dividing brightness values 32 and 34. More specifically, a maximum brightness determining means 40 examines all the voxel values within the volume memory means C to determine the brightest voxel value. A range determining means 42 determines an intermediate range of voxel values, particularly the voxel values which fall into the high uncertainty range. In the preferred embodiment, voxel values which are 61–100% of the maximum brightness are considered highly probable of being blood. Voxel values below 20% of the maximum brightness are considered highly probable of being non-blood tissue. Those in the 20–60% range are considered to have the highest uncertainty. An averaging means 44 averages the voxel values within the range designated by range means 42 to determine a median brightness or voxel value. This median brightness or voxel value is an estimate of a peak 36 of the histogram between regions 32 and 34 of FIG. 2. A standard deviation means 46 determines an appropriate deviation or variance to either side of the peak which is to be taken as the demarcation brightness values 32 and 34. In the preferred embodiment, 0.6 times the average or median brightness has been found to be an accurate predictor of the lower brightness demarcation value 34 and 1.2 times the median brightness value has been found to correspond relatively accurately to the upper brightness demarcation value 32.

A sorting means 48 sorts the voxel values $V_1, V_2, V_3, \ldots V_n$ of each received ray into buffer memories 50a, 50b, and 50c in accordance with whether each voxel value falls below lower demarcation brightness value 34, above upper brightness demarcation value 32, or between the two brightness demarcation values. The expanding means 20 and the self-normalizing means 22 then process the voxel values within each of the buffer memories 50a, 50b, and 50c, serially. That is, they process the voxel values in each of the three brightness regions separately. A controlling means 52 controls the buffer memories 50 to feed their contents serially to the expanding means 20 and the normalizing means 22. Concurrently with the feeding of the values from each buffer register means to the expanding and normalizing means, the control means causes an exponent selecting means 54 to designate the appropriate value of N for the voxel values for each of the ray brightness segments. In the preferred embodiment, the voxel values above the upper demarcation brightness value 32 and below the lower demarcation brightness value 34 are relatively certain. Hence, N is selected relatively low when processing these portions of the ray, preferably N=2. However, in the uncertain region between brightness demarcation values 32 and 34, a larger separation is achieved by selecting a higher value of N. In the preferred embodiment, N=11.

Because each of the three brightness ranges are handled separately, three values $S_1, S_2, S_3$ are now generated for each ray. A weighted averaging means 56 performs a weighted average of the three sums S. More specifically to the preferred embodiment, the weighted averaging means 56 divides the sum of the sums S raised to the power M by the sum of the sums S raised to the power (M−1) for normalization purposes. In the preferred embodiment, M=3.

$$P(i,j) = \frac{\sum_{m=1}^{3} S_m^3}{\sum_{m=1}^{3} S_m^2} \quad (2)$$

where $$S_1 = \frac{\sum_{V>(32)} V^2}{\sum_{V>(32)} V}, \quad (3a)$$

$$S_2 = \frac{\sum_{(34)<V<(32)} V^{11}}{\sum_{(34)<V<(32)} V^{10}}, \text{ and} \quad (3b)$$

$$S_3 = \frac{\sum_{V<(34)} V^2}{\sum_{V<(34)} V}. \quad (3c)$$

Of course, other weighted averages can also be used.

Although the probability region is divided into three segments for simplicity of calculation, it is to be appreciated that a larger number of segments may be provided to provide a smoother transition between the regions. For example, rather than three regions, additional regions may be added adjacent the demarcation brightness values 32 and 34 to provide a smoother transition. In these added regions, N has values intermediate to those suggested above. As another alternative, a continuous probability function is generated such that the degree of non-linear extension between the various probabilities varies on a continuum or a closer approximation of a continuum.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus for producing an angiographic shadowgraphic image, the apparatus comprising:

a means for generating views of magnetic resonance data from a region of a subject in an examination region;

a reconstruction means for reconstructing the views into voxel values of a volumetric image representation;

a ray projecting means for projecting rays from a viewing plane into the volumetric image data and retrieving a one-dimensional array of voxel values from the volumetric image data intersected by each ray;

an expansion means for raising the voxel values of each ray to an exponent N to expand a dynamic range of the voxel values non-linearly and summing the voxel values raised to the exponent, where $N \geq 2$;

a normalizing means for raising the same voxel values to an exponent lower than N and summing the voxel values raised to the lower exponent;

a means for generating a weighted pixel value by dividing the sum from the expansion means with the sum from the normalizing means;

an image memory means for storing the weighted pixel value generated from each projected ray for display as the angiographic image.

2. The apparatus as set forth in claim 1 further including:

a probability determining means for determining a probability that each of the voxel values correspond to blood and non-blood tissue; and, a control means for adjusting the exponent N in accordance with the probability determined by the probability means.

3. The apparatus as set forth in claim 2 wherein the probability determining means divides the voxel values into a plurality of ranges and further including:

a plurality of buffer memory means for holding the voxel values of each ray corresponding to one of the ranges, the control means causing the expansion means and the normalizing means to process the data from each of the buffer memory means serially and for controlling the exponent N as the voxel values of each range are processed.

4. The apparatus as set forth in claim 3 wherein the weighted pixel generating means produces a plurality of normalized sums, one normalized sum corresponding to each of the ranges and further including a weighted averaging means for weightedly averaging the sums corresponding to each ray to produce the weighted pixel value for storage in the image memory means.

5. The apparatus as set forth in claim 4 wherein the weighted averaging means includes a means for raising the sum corresponding to each of the ranges to a power M and adding the sums;

for raising the sum corresponding to each of the ranges to the exponent M−1 and adding the sums; and for dividing the added sums to produce the weighted pixel value.

6. An angiographic imaging apparatus for generating angiographic images from magnetic resonance data, the apparatus comprising:

a volumetric data memory means for storing voxel values reconstructed from the magnetic resonance data, each voxel value representing a characteristic of a subregion of a magnetic resonance examined volumetric region of a patient;

a ray projecting means for projecting rays from a viewing plane into the examined volumetric region and retrieving a one-dimensional array of voxel values from the volumetric data memory means corresponding to each ray;

a probability means for examining voxel values of the volumetric data memory means and developing a relationship between the voxel values and a probability that the characteristic of each voxel value indicates blood and non-blood tissue in the corresponding subregion;

an expansion means for non-linearly adjusting voxel values corresponding to each ray such that voxel values which the probability means indicates have a greater uncertainty of being blood and non-blood tissue are expanded more than voxel values which the probability means indicates have a greater probability of being blood and non-blood tissue;

a means for weightedly combining the pixel values along each ray as received from the expanding means to derive an angiographic image pixel value corresponding to each ray;

an image memory means for storing the angiographic pixel values from the weighted combining means.

7. The apparatus as set forth in claim 6 wherein the expansion means includes a means for raising voxel values to a power N, in which the power N is larger for voxel values with a relatively high uncertainty than for voxel value magnitudes with a relatively high probability of representing blood and non-blood tissue.

8. The apparatus as set forth in claim 7 wherein the expansion means further includes means for summing at least a portion of the voxel values corresponding to each ray raised to the power N; and wherein the weighted combining means includes a normalizing means for raising at least the portion of the voxel values corresponding to each ray to the power N−1 and summing the voxel values raised to the power N−1; and a dividing means for dividing the sum of the expansion means by the sum of the normalizing means.

9. The apparatus as set forth in claim 8 wherein the expansion means and the normalizing means each sum several portions of the voxel values corresponding to each ray and the dividing means divides the sums of corresponding portions and further includes a weighted averaging means for raising the sums of each portion from the dividing means to an exponent M and adding the sums, raising the sums to the exponent M−1 and adding the sums, and dividing one of the added sums by the other to produce the angiographic pixel value.

10. An apparatus for generating improved projection images, the apparatus comprising:

a ray projection means for projecting a plurality of rays along parallel paths into volumetric image data and retrieving a vector of voxel values from the volumetric image data corresponding to each ray, each of the projected rays corresponding to a projection image pixel;

a sorting means for sorting the voxel values of each vector from the ray projecting means into one of a plurality of vector portions;

an expansion means for raising each of the voxel values of each vector portion to an exponent and summing the voxel values of each vector portion raised to the exponent to create a first partial sum, the exponent for some of the vector portions of each vector being different than the exponent for other vector portions;

a normalizing means for raising the voxel values of each vector portion to an exponent not higher than the exponent to which corresponding voxel values of each vector portion are raised by the expansion means and summing said voxel values raised to the exponent to form a second partial sum;

a dividing means for dividing the partial sums corresponding to each vector portion to generate a plurality of normalized sums for each vector, one normalized sum corresponding to each vector portion;

a weighted averaging means for weightedly averaging the sums for each vector portion of a common vector to generate a projection image pixel value for storage in a projection image memory means.

11. A magnetic resonance imaging method for producing an angiographic shadowgraphic image, the method comprising:

generating views of magnetic resonance data from a volumetric region of a subject in an examination region;

reconstructing the views into a plurality of voxel values of a volumetric image representation;

projecting rays from a viewing plane into the volumetric image representation and retrieving a one-dimensional array of voxel values;

raising voxel values of each ray to an exponent N and summing the voxel values raised to the exponent, where $N \geq 2$;

raising the same voxel values to an exponent lower than N and summing the voxel values raised to the lower exponent;

dividing one of the sums of the voxel values raised to exponents by the other to generate weighted pixel values;

converting the weighted pixel values to a human-readable angiographic image representation.

12. The method as set forth in claim 11 wherein $N \geq 9$.

13. The method as set forth in claim 11 further including:

determining a probability that voxel values of the volumetric image representation correspond to blood and non-blood tissue; and, adjusting the exponent N in accordance with the determined probability.

14. The method as set forth in claim 11 further including:

dividing the voxel values into a plurality of ranges in accordance with relative probabilities of representing blood and non-blood tissue;

raising the voxel values in each range to the exponent N and summing the voxel values;

raising the voxel values in each range to the exponent N−1 and summing the voxel values of each range;

dividing the sums of the voxel values in each range to generate a plurality of normalized sums;

weightedly averaging the normalized sums to produce the corresponding weighted pixel value of the angiographic image.

15. The method as set forth in claim 14 wherein the weighted averaging step includes:

raising the sum of each range to a power M and adding the sums;

raising the sum corresponding of each range to the exponent M−1 and adding the sums; and dividing the added sums to produce the weighted pixel value.

16. An angiographic imaging method for generating angiographic images from magnetic resonance data, the method comprising:

projecting rays from a viewing plane into a three-dimensional magnetic resonance data set and retrieving a one-dimensional array of voxel values from the magnetic resonance data set for each ray;

determining a probability that each voxel value of the magnetic resonance data set represents blood and non-blood tissue;

non-linearly adjusting the relative voxel values of each ray such that voxel values with a greater uncertainty of being blood or non-blood tissue are expanded more than voxel values with a higher probability of being blood tissue or non-blood tissue;

weightedly combining the voxel values of each ray to generate an angiographic image pixel value corresponding to each ray.

17. The apparatus as set forth in claim 16 wherein the non-linear adjusting step includes raising voxel values to a power N, where the power N is larger for voxel values with the greater uncertainty than for voxel values with the high probability of representing blood or non-blood tissue.

18. The method as set forth in claim 17 wherein the non-linear adjusting step further includes:

summing the voxel values raised to the power N;

raising the voxel values of each ray to the power N−1;

summing the voxel values raised to the power N−1; and dividing the sum of the voxel values raised to the exponent N by the sum of the voxel values raised to the exponent N−1.

19. The method as set forth in claim 16 wherein the non-linear adjusting step includes:

sorting the voxel values of each ray into a plurality of groups;

raising the voxel values of each group to an exponent, the exponent to which some groups are raised being different from the exponent to which other groups are raised;

summing the voxel values raised to an exponent of each group;

normalizing the sum of each group;

weightedly averaging the normalized sums to produce the angiographic image pixel values.

20. A method for generating improved projection images, the method comprising:

a) projecting a plurality of rays into volumetric image data and retrieving a vector of voxel values from the volumetric image data corresponding to each ray, each of the projected rays corresponding to a projection image pixel;

b) sorting the voxel values of each vector into one of a plurality of vector portions;

c) raising each of the voxel values of each vector portion to an exponent and summing the voxel values of each vector portion raised to the exponent to create a first partial sum corresponding to each vector portion, the exponent for some of the vector portions being different than the exponent for other vector portions;

d) raising the voxel values of each vector portion to an exponent not higher than the exponent to which corresponding voxel values of each vector portion are raised in step (c) and summing said voxel values raised to the lower power to form a second partial sum for each vector portion;

e) dividing the partial sums corresponding to each vector portion to generate a plurality of normalized partial sums for each vector, one normalized partial sum corresponding to each vector portion;

f) combining the partial sums for each vector portion of a common vector to generate a projection image pixel value.

* * * * *